US011835592B2

(12) United States Patent
Cheng

(10) Patent No.: US 11,835,592 B2
(45) Date of Patent: Dec. 5, 2023

(54) METHOD AND CIRCUIT FOR MONITORING VOLTAGE OF POWER SUPPLY

(71) Applicant: INFSITRONIX TECHNOLOGY CORPORATION, Jhubei (TW)

(72) Inventor: Yuan-Kai Cheng, Jhubei (TW)

(73) Assignee: Infsitronix Technology Corporation, Jhubei (TW)

( * ) Notice: Subject to any disclaimer, the term of this patent is extended or adjusted under 35 U.S.C. 154(b) by 0 days.

(21) Appl. No.: 17/934,744

(22) Filed: Sep. 23, 2022

(65) Prior Publication Data
US 2023/0160973 A1   May 25, 2023

Related U.S. Application Data

(60) Provisional application No. 63/247,487, filed on Sep. 23, 2021.

(51) Int. Cl.
*G01R 31/40* (2020.01)
*G01R 19/165* (2006.01)
(Continued)

(52) U.S. Cl.
CPC .............. *G01R 31/40* (2013.01); *G01K 7/22* (2013.01); *G01R 15/04* (2013.01);
(Continued)

(58) Field of Classification Search
CPC .. G01R 31/40; G01R 15/04; G01R 19/16538; G01R 19/1659; G01K 7/22; H02H 3/20;
(Continued)

(56) References Cited

U.S. PATENT DOCUMENTS 11,257,548 B2 * 2/2022 Kimura ............... H02H 3/20
2002/0000844 A1   1/2002 Yoshida
(Continued)

FOREIGN PATENT DOCUMENTS

TW       201316658 A    4/2013
TW       I574494 B      3/2017
(Continued)

OTHER PUBLICATIONS

Office Action mailed to corresponding Taiwanese Patent Application No. 111136261 dated Aug. 9, 2023.
Search Report mailed to Corresponding Taiwanese Patent Application No. 111136261 dated Aug. 9, 2023.

*Primary Examiner* — Giovanni Astacio-Oquendo
(74) *Attorney, Agent, or Firm* — Rosenberg, Klein & Lee

(57) ABSTRACT

The present application provides method and circuit for monitoring a voltage of a power supply, which adopts a divided voltage circuit to obtain a divided voltage from an input voltage of an input power source generated from the power supply, for detecting the input voltage according to the divided voltage by adopting a first detection circuit and a second detection circuit. Also, judging whether the divided voltage is clamped according to a clamp threshold value to determine the first detection circuit or the second detection circuit detecting a detection current and determine another detection circuit detecting the divided voltage. Hereby, the input voltage transmitted from a rectification circuit to the power supply is monitored, and the dependence between the two detection circuits is avoided.

22 Claims, 9 Drawing Sheets

(51) Int. Cl.
  *G01R 15/04* (2006.01)
  *G01K 7/22* (2006.01)
  *H02H 3/20* (2006.01)
  *H02H 5/04* (2006.01)
  *H02M 3/335* (2006.01)

(52) U.S. Cl.
  CPC ... *G01R 19/1659* (2013.01); *G01R 19/16538* (2013.01); *H02H 3/20* (2013.01); *H02H 5/04* (2013.01); *H02M 3/33592* (2013.01)

(58) Field of Classification Search
  CPC ... H02H 5/04; H02H 7/1213; H02M 3/33592; Y02B 70/10
  See application file for complete search history.

(56) References Cited

U.S. PATENT DOCUMENTS

| | | | | |
|---|---|---|---|---|
| 2023/0168312 | A1* | 6/2023 | Cheng | H02H 5/04 |
| | | | | 361/91.1 |
| 2023/0216419 | A1* | 7/2023 | Hung | G01R 19/1659 |
| | | | | 363/21.06 |

FOREIGN PATENT DOCUMENTS

| | | | |
|---|---|---|---|
| TW | I579576 B | 4/2017 | |
| TW | I618342 B | 3/2018 | |

\* cited by examiner

METHOD AND CIRCUIT FOR MONITORING VOLTAGE OF POWER SUPPLY

FIELD OF THE INVENTION

The present application generally relates to a monitoring method and the circuit thereof, and particularly to a method and a circuit for monitoring a voltage of a power supply.

BACKGROUND OF THE INVENTION

In a modern AC-to-DC power supply, a high-voltage detection circuit and a low-voltage detection circuit will be generally disposed for detecting the input voltage of the power supply from a power supplying device. According to the detection result of the input voltage, various applications will be provided.

The high-voltage and low-voltage detection circuits mentioned above are normally integrated in an integrated circuit chip. Unfortunately, it is difficult to alter the circuit in a chip. To change the threshold values of the high-voltage and low-voltage detection circuits easily, voltage division circuits set at external of the chip can be used to acquire a divided voltage corresponding to the input voltage of the power supply. Thereby, chip vendors only need to alter the resistance ratio of the voltage division circuit and set the threshold values of the high-voltage and low-voltage detection circuits. Nonetheless, to save circuit costs, the above high-voltage and low-voltage detection circuits are designed to share a common voltage division node, which makes the threshold values of the high-voltage and low-voltage detection circuits interdependent. In other words, if the threshold value for high-voltage detection is adjusted by changing the ratio of the divided voltage, the threshold value for low-voltage detection will be influenced, and vice versa.

Accordingly, it is necessary to improve the prior art.

SUMMARY

An objective of the present application is to provide a method and a circuit for monitoring a voltage of a power supplier. A voltage division circuit acquires a divided voltage of the input voltage of an input power source of the power supply. According to whether the divided voltage exceeds a clamp threshold value, whether a first detection circuit detects a detection current flowing therein and a second detection circuit detects the divided voltage can be determined. Hereby, the input voltage transmitted to the power supply by a rectifying circuit can be monitored, and the interdependency between the two detection circuits can be avoided.

Another objective of the present application is to provide a method and a circuit for monitoring a voltage of a power supply. A voltage division circuit acquires a divided voltage of the input voltage of an input power source of the power supply. According to whether the divided voltage fails to exceed a clamp threshold value, whether a first detection circuit detects the input voltage according to a detection current flowing therein and a second detection circuit detects the divided voltage can be determined. Thereby, the input voltage transmitted to the power supply by a rectifying circuit can be monitored, and the interdependency between the two detection circuits can be avoided.

To achieve the above objectives, the present application provides a method for monitoring a voltage of a power supply and is applicable to monitoring an input voltage transmitted to an input power source of the power supply by a rectifying circuit. According to the voltage monitoring method of the present application, a voltage division circuit is used to divide the input voltage and acquire a divided voltage. A first detection circuit and a second detection circuit detect the input voltage according to the divided voltage. Then, the first and second detection circuits generate a first voltage signal and a second voltage signal, respectively, according to the divided voltage, a first threshold value, and a second threshold value. When the divided voltage exceeds a clamp threshold value, the first detection circuit clamps the divided voltage and detects the input voltage according to a detection current flowing therein. The second detection circuit detects the input voltage according to the divided voltage. In addition, the first detection circuit generates the first voltage signal when the first detection circuit judges that the input voltage is greater than the first threshold value according to the detection current; the second detection circuit generates the second voltage signal when the second detection circuit judges that the input voltage is less than the second threshold value according to the divided voltage. Thereby, the input voltage of the input power source of the power supply can be monitored and the interdependency of the first and second detection circuits can be avoided. Consequently, the device parameters of the first and second detection circuits can be adjusted independently.

The present application further provides a method for monitoring a voltage of a power supply and is applicable to monitoring an input voltage transmitted to an input power source of the power supply by a rectifying circuit. According to the voltage monitoring method of the present application, a voltage division circuit is used to divide the input voltage and acquire a divided voltage. A first detection circuit and a second detection circuit detect the input voltage according to the divided voltage. Then, the first and second detection circuits generate a first voltage signal and a second voltage signal, respectively, according to the divided voltage, a first threshold value, and a second threshold value. When the divided voltage fails to exceed a clamp threshold value, the first detection circuit clamps the divided voltage and detects the input voltage according to a detection current flowing therein. The first detection circuit detects the input voltage according to the divided voltage. In addition, the second detection circuit generates the second voltage signal when the second detection circuit judges that the input voltage is less than the second threshold value according to the detection current; the first detection circuit generates the first voltage signal when the first detection circuit judges that the divided voltage is greater than the first threshold value according to the divided voltage. Thereby, the input voltage transmitted to the input power source of the power supply can be monitored, and the interdependency of the first and second detection circuits can be avoided. Consequently, the device parameters of the first and second detection circuits can be adjusted independently.

The present application further provides a circuit for monitoring a voltage of a power supply and is applicable to monitoring an input voltage of an input power source of the power supply transmitted by a rectifying circuit. The voltage monitoring circuit according to the present application comprises a first detection circuit and a second detection circuit coupled between a first impedance element and a second impedance element of a voltage division circuit for acquiring a divided voltage of the input power source. When the divided voltage exceeds a clamp threshold value, the first detection circuit clamps the divided voltage and detects the input voltage according to a detection current flowing therein. The second detection circuit detects the input voltage according to the divided voltage. In addition, the first detection circuit generates the first voltage signal when the first detection circuit judges that the input voltage is greater than the first threshold value according to the detection current; the second detection circuit generates the second voltage signal when the second detection circuit judges that the input voltage is less than the second threshold value according to the divided voltage. Thereby, the input voltage transmitted to the input power source of the power supply can be monitored, and the interdependency of the first and second detection circuits can be avoided.

The present application further provides a circuit for voltage monitoring of a power supply and is applicable to monitoring an input voltage transmitted to an input power source of the power supply by a rectifying circuit. The voltage monitoring circuit according to the present application comprises a first detection circuit and a second detection circuit coupled between a first impedance element and a second impedance element of a voltage division circuit for acquiring a divided voltage of the input power source. When the divided voltage fails to exceed a clamp threshold value, the first detection circuit clamps the divided voltage and detects the input voltage according to a detection current flowing therein. The second detection circuit detects the input voltage according to the divided voltage. In addition, the first detection circuit generates the first voltage signal when the first detection circuit judges that the input voltage is greater than the first threshold value according to the detection current; the second detection circuit generates the second voltage signal when the second detection circuit judges that the input voltage is less than the second threshold value according to the divided voltage. Thereby, the input voltage transmitted to the input power source of the power supply can be monitored, and the interdependency of the first and second detection circuits can be avoided.

DETAILED DESCRIPTION

In order to make the structure and characteristics as well as the effectiveness of the present application to be further understood and recognized, the detailed description of the present application is provided as follows along with embodiments and accompanying figures.

To solve the problem of interdependence between the threshold values of the two detection circuits according to the prior art, the present application provides a method and a circuit for monitoring a voltage of a power supply and the method thereof. When a divided voltage of an input voltage of a detection circuit exceeds or does not exceed a clamp threshold value, one detection circuit clamps the divided voltage and detects the input voltage according to a detection current flowing in. The other detection circuit is responsible for detecting the divided voltage to avoid interdependence of the two detection circuits.

In the following description, various embodiments of the present application are described using figures for describing the present application in detail. Nonetheless, the concepts of the present application can be embodied in various forms. Those embodiments are not used to limit the scope and range of the present application.

Figure 1:
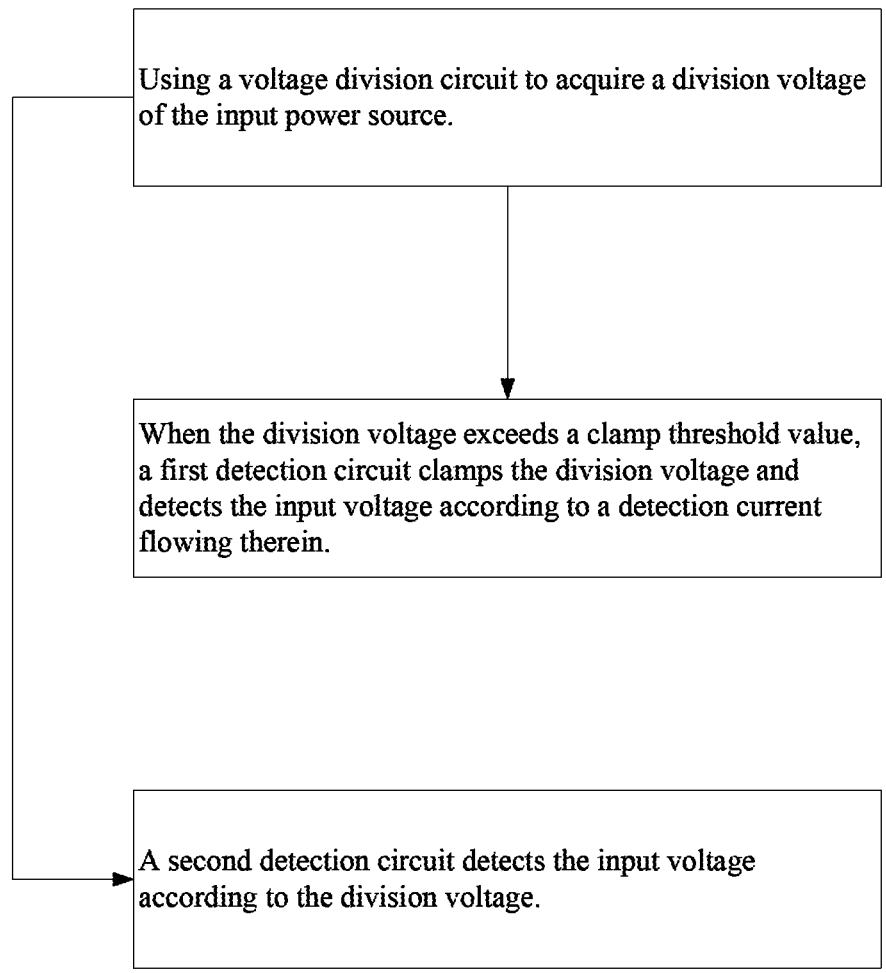
FIG. 1 shows a flowchart of the method for voltage monitoring of the power supply according to an embodiment of the present application.

First, please refer to FIG. 1, which shows a flowchart of the method for monitoring the voltage of the power supply according to an embodiment of the present application. To illustrate the voltage monitoring methods of various embodiments, in the following, the circuits adopted by the voltage monitoring methods of various embodiments will be illustrated as well.

Figure 2:
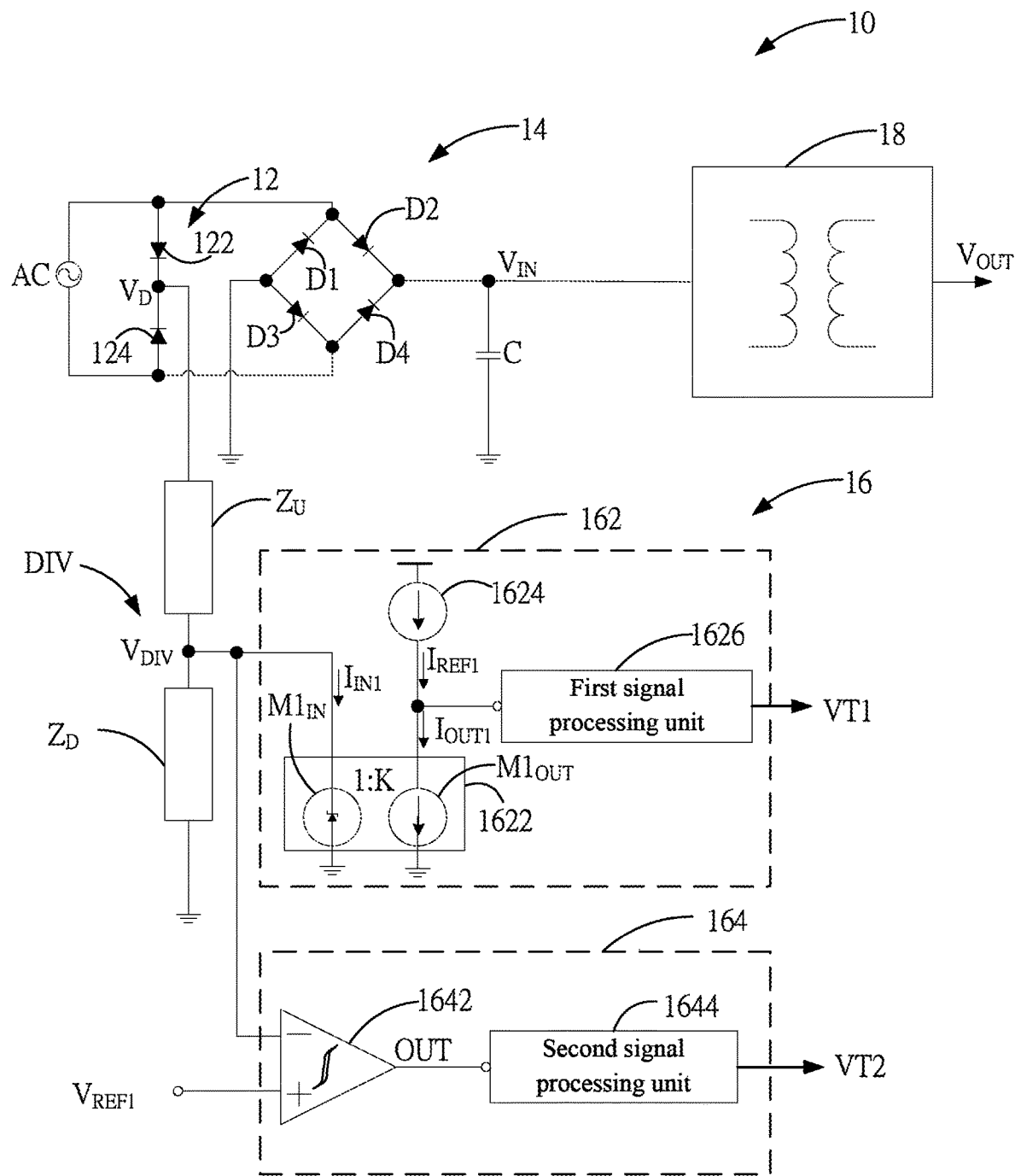
FIG. 2 shows a schematic diagram of the circuit according to the first embodiment of the present application.

Please refer to FIG. 2, which shows a schematic diagram of the circuit according to the first embodiment of the present application. As shown in the figure, a power supplying device 10 according to the present embodiment receives an alternate-current (AC) power source AC and includes a voltage extraction unit 12, a rectifying circuit 14, a voltage monitoring circuit 16, and a power supply 18. The voltage extraction unit 12 includes a first diode 122 and a second diode 124 for converting the AC power source AC to a direct-current (DC) extraction voltage $V_D$. The rectifying circuit 14 is a normal bridge rectifying circuit, which includes a first rectifying element D1, a second rectifying element D2, a third rectifying element D3, and a fourth rectifying element D4 for rectifying the AC power source AC, forming a DC input power source, and supplying the DC power source to the power supply 18. Nonetheless, the present application is not limited to the embodiment. The voltage monitoring circuit 16 includes a first detection circuit 162 and a second detection circuit 164. The first detection circuit 162 and the second detection circuit 164 are coupled to a voltage division circuit DIV The voltage division circuit DIV includes a first impedance element $Z_U$ and a second impedance element $Z_D$ coupled mutually. The voltage between the first impedance element $Z_U$ and the second impedance element $Z_D$ is a divided voltage $V_{DIV}$. According to the present embodiment, the voltage extraction unit 12 provides the extraction voltage $V_D$ to the voltage division circuit DIV according to the AC power source AC. Thereby, the voltage division circuit DIV can provide the divided voltage $V_{DIV}$ via the first impedance element $Z_U$ and the second impedance element $Z_D$. The extraction voltage $V_D$ is related to an input voltage $V_{IN}$ of the input power source to the power supply 18 from the rectifying circuit 14.

Thereby, the voltage monitoring circuit 16 can monitor the input voltage $V_{IN}$ via the divided voltage $V_{DIV}$.

Figure 3:
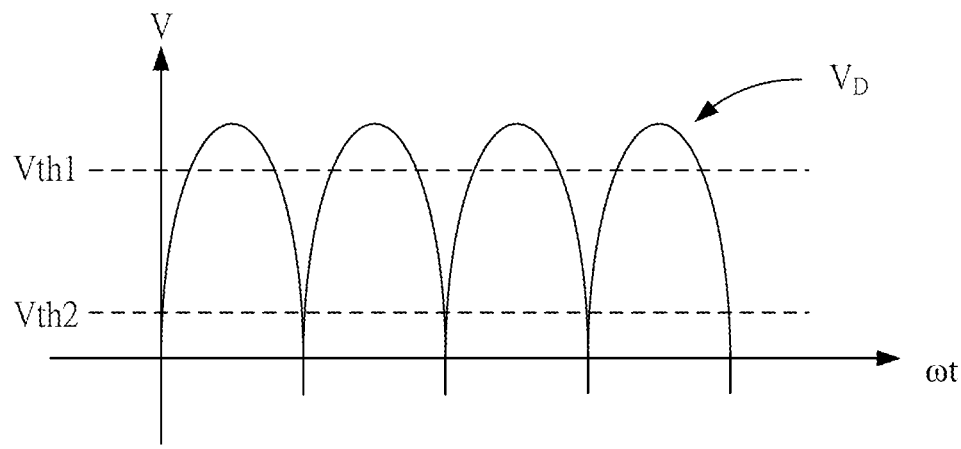
FIG. 3 shows a schematic diagram of the signal at the output of the voltage extraction unit according to the first embodiment of the present application.
Figure 4:
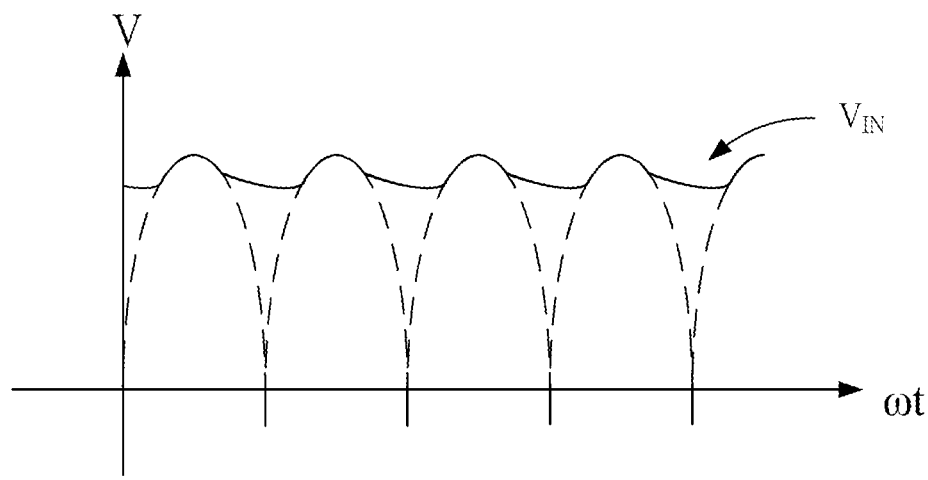
FIG. 4 shows a schematic diagram of the signal of the input voltage input to the power supply according to the present application.

To elaborate, please refer to FIG. 3, which shows a waveform of the DC extraction voltage $V_D$ converted from the AC power source AC by the voltage extraction unit 12. FIG. 4 shows a DC input voltage rectified by the rectifying circuit 14 according to the AC power source AC. The rectifying circuit 14 generates the waveform of the input voltage $V_{IN}$ of the input power source as shown in FIG. 4 by using the first rectifying element D1, the second rectifying element D2, the third rectifying element D3, and the fourth rectifying element D4, which are diodes, and an input capacitor C, which provides energy storage. The input voltage $V_{IN}$ is output to the power supply 18. According to FIG. 3 and FIG. 4, it is observed that the extraction voltage $V_D$ is related to the input voltage $V_{IN}$ of the power supply 18 from the rectifying circuit 14. Thereby, the extraction voltage $V_D$ can be used to monitor the input voltage $V_{IN}$.

In the voltage monitoring circuit 16 according to the present embodiment, the first detection circuit 162 and the second detection circuit 164 detect the input voltage $V_{IN}$ according to the divided voltage $V_{DIV}$. Thereby, the first detection circuit 162 and the second detection circuit 164 generate a first voltage signal VT1 or a second voltage signal VT2, respectively, according to the divided voltage $V_{DIV}$, a first threshold value Vth1, and a second threshold value Vth2. The first threshold value Vth1 according to the present embodiment corresponds to a first reference current $I_{REF1}$ of the first detection circuit 162; the second threshold value Vth2 corresponds to a reference voltage $V_{REF1}$ of the second detection circuit 164. The first reference current $I_{REF1}$ and the first reference current $I_{REF1}$ are the default parameters of the first and second detection circuits 162, 164 in the IC design and fabrication steps. The first and second detection circuits 162, 164 can include analog circuits or logic operational circuits.

Figure 5:
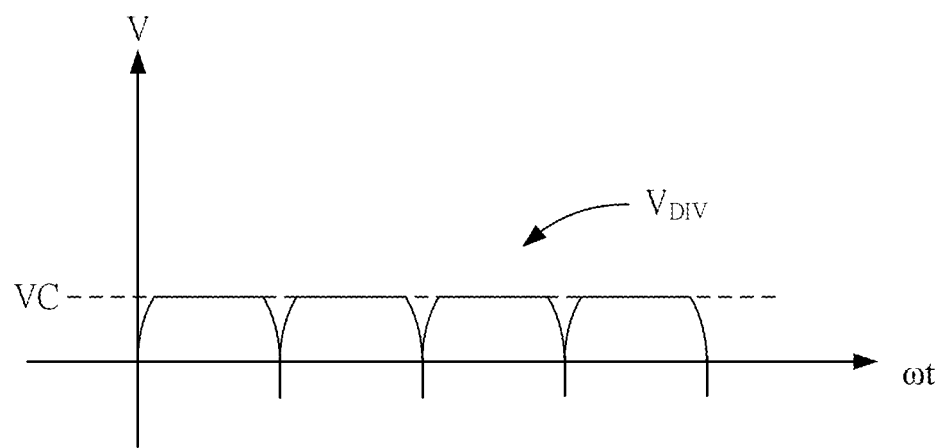
FIG. 5 shows a schematic diagram of the signal of the clamped divided voltage according to the present application.

To elaborate, according to the present embodiment, when the divided voltage $V_{DIV}$ exceeds a clamp threshold value VC, as shown in FIG. 5, the first detection circuit 162 clamps the divided voltage $V_{DIV}$ so that the divided voltage $V_{DIV}$ can be maintained to be equal or close to the clamp threshold value VC. In addition, the first detection circuit 162 detects the input voltage $V_{IN}$ according to a detection current $I_{IN1}$ flowing into the first detection circuit 162. Since the divided voltage $V_{DIV}$ is clamped, when the voltage of the AC power source AC is increased, the extraction voltage $V_D$ will be increased and the detection current $I_{IN1}$ flowing into the first detection circuit 162 will be increased accordingly. On the contrary, when the voltage of the AC power source AC is decreased, the extraction voltage $V_D$ will be decreased and the detection current $I_{IN1}$ flowing into the first detection circuit 162 will be decreased accordingly. Thereby, the detection current $I_{IN1}$ can be used to judge the magnitude of the AC power source AC and the input voltage $V_{IN}$. Accordingly, when the first detection circuit 162 judges that the input voltage $V_{IN}$ is greater than the first threshold value Vth1 according to the value of the detection current the first detection circuit 162 generates the first voltage signal VT1.

Once the extraction voltage $V_D$ is decreased to make the divided voltage $V_{DIV}$ not exceed the clamp threshold value VC, the first detection circuit 162 will stop clamping the divided voltage $V_{DIV}$. Then, the second detection circuit 164 detects the input voltage $V_{IN}$ according to the divided voltage $V_{DIV}$. When the second detection circuit 164 judges that the input voltage $V_{IN}$ is less than the second threshold value Vth2 according to the divided voltage $V_{DIV}$, the second detection circuit 164 generates the second voltage signal VT2.

To elaborate, according to the present embodiment, the first detection circuit 162 includes a current mirror 1622, a reference current source 1624, and a first signal processing unit 1626. The current mirror 1622 includes a first mirror input unit $M1_{IN}$ and a first mirror output unit $M1_{out}$. The first mirror input unit $M_{1N}$ clamps the divided voltage $V_{DIV}$ when the divided voltage $V_{DIV}$ exceeds the clamp threshold value VC and receives the detection current Tim. The first mirror output unit $M1_{out}$ outputs a first mirror current $I_{OUT1}$ correspondingly. The reference current source 1624 according to the present embodiment provides the first reference current $I_{REF1}$. The first signal processing unit 1626 judges the magnitude of the detection current $I_{IN1}$ according to the first reference current $I_{REF1}$ and the first mirror current $I_{OUT1}$, and then further judges if the input voltage $V_{IN}$ exceeds the first threshold value Vth1. When the first signal processing unit 1626 judges that the input voltage $V_{IN}$ is greater than the first threshold value Vth1, it generates the first voltage signal VT1. The detection current $I_{IN1}$ is the input current of the current mirror 1622. The first mirror current $I_{OUT1}$ is an output current of the current mirror 1622 and is a multiple of the detection current $I_{IN1}$. In other words, the ratio of the first mirror current $I_{OUT1}$ to the detection current $I_{IN1}$ is K, $I_{IN1}:I_{OUT1}=1:K$. The ratio can be adjusted according to requirements of circuit application. The clamp threshold value VC is greater than the reference voltage $V_{REF1}$ used by the second detection circuit 164 (as described below). Besides, when the divided voltage $V_{DIV}$ is less than the clamp threshold value VC, the detection current Tim is ideally zero.

According to the present embodiment, the second detection circuit 164 includes a comparator 1642 and a second signal processing unit 1644. The comparator 1642 includes a positive input and a negative input. The comparator 1642 is coupled to the reference voltage $V_{REF1}$ via the positive input and to the divided voltage $V_{DIV}$ via the negative input. Thereby, the comparator 1642 generates a comparison result OUT at an output and transmits the comparison result OUT to the second signal processing unit 1644. The second signal processing unit 1644 judges if the input voltage $V_{IN}$ is less than the second threshold value Vth2 according to the comparison result OUT. When the input voltage $V_{IN}$ is judged to be less than the second threshold value Vth2, the second signal processing unit 1644 generates the second voltage signal VT2.

Moreover, according to the present embodiment, the power supply 18 executes a first mechanism according to the first voltage signal VT1. The first mechanism can be, for example, an over voltage protection, a high voltage judgement, or an input voltage switching. The power supply 18 executes a second mechanism according to the second voltage signal VT2. The second mechanism can be, for example, a low voltage protection or a minimum startup voltage setup.

According to the above description, the voltage monitoring circuit 16 according to the present application uses the first and second detection circuits 162, 164 to detect the input voltage $V_{IN}$ according to the divided voltage $V_{DIV}$. Then, the first and second detection circuits 162, 164 can generate the first voltage signal VT1 or the second voltage signal VT2 according to the divided voltage $V_{DIV}$, the first threshold value Vth1, and the second threshold value Vth2, respectively. Meanwhile, when the divided voltage $V_{DIV}$ exceeds the clamp threshold value VC, as shown in FIG. 5, the first detection circuit 162 clamps the divided voltage $V_{DIV}$ and detects the input voltage $V_{IN}$ according to the detection current $I_{IN1}$. The second detection circuit 164 detects the input voltage $V_{IN}$ according to the divided voltage $V_{DIV}$. Accordingly, the first and second detection circuit 162, 164 can be applied for detecting the input voltage $V_{IN}$. Besides, parameters of the first and second detection circuit 162, 164 can be set individually.

Figure 6:
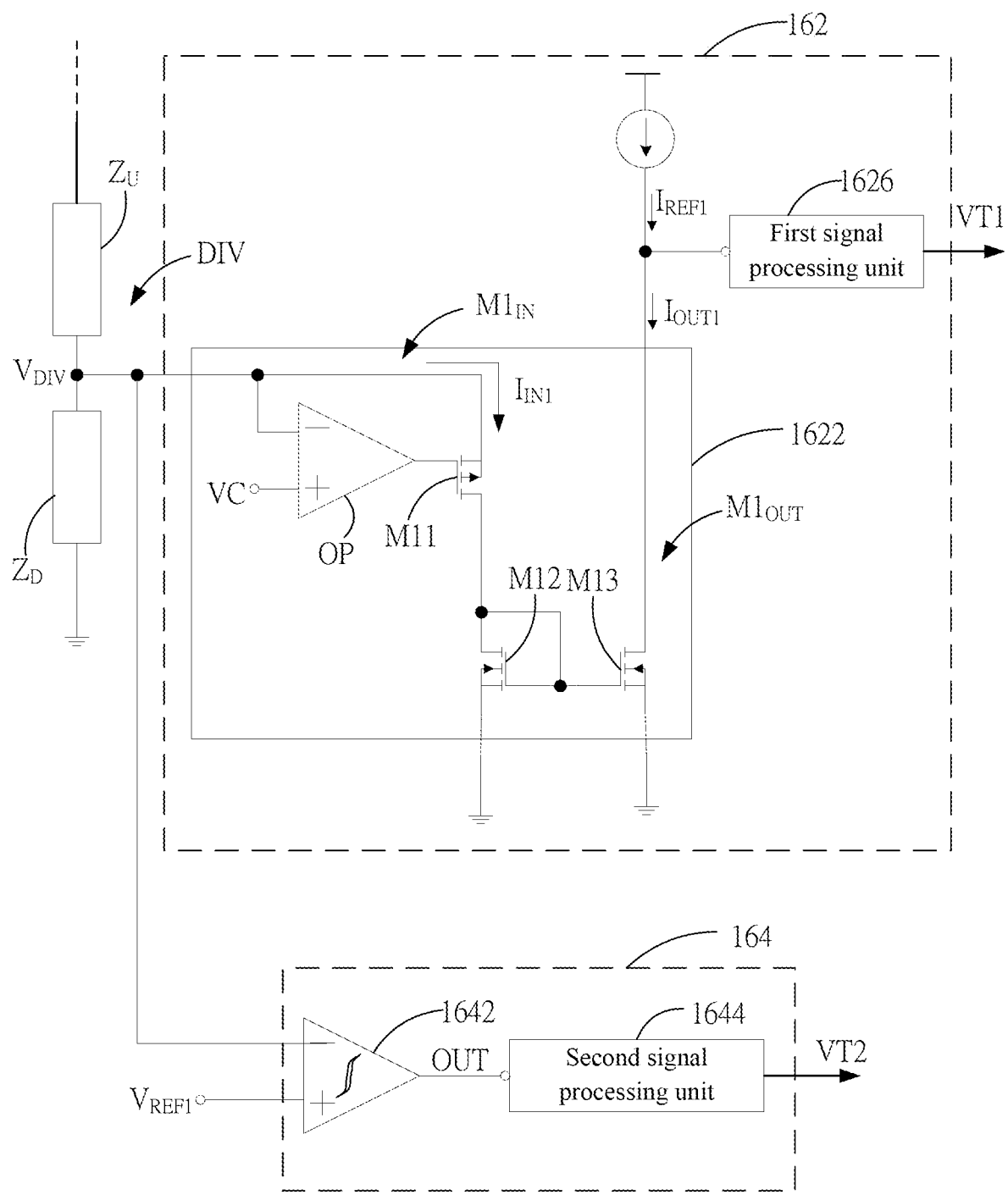
FIG. 6 shows an exemplary schematic diagram of the detailed circuit of the detection circuit according to the first embodiment of the present application.

FIG. 6 shows an exemplary schematic diagram of the detailed circuit of the first detection circuit 162. The first mirror input unit $M1_{IN}$ includes an operational amplifier OP, an input transistor M11, and a first mirror transistor M12. The first mirror output unit $M1_{OUT}$ includes a first output transistor M13. A positive input of the operational amplifier OP is coupled to the clamp threshold value VC; a negative input of the operational amplifier OP is coupled to the divided voltage $V_{DIV}$. Thereby, when the divided voltage $V_{DIV}$ does not exceed the clamp threshold value VC, the input transistor M11 is cut off and thus disabling the first detection circuit 162. At this time, the first detection circuit 162 will not influence the divided voltage $V_{DIV}$. Once the divided voltage $V_{DIV}$ exceeds the clamp threshold value VC, the operational amplifier OP controls the input transistor M11 to turn on the detection current $I_{IN1}$. By using the virtual short-circuit property of the operation amplifier OP, the divided voltage $V_{DIV}$ is clamped, and maintained to be equal or close to the clamp threshold value VC. In addition, the first mirror transistor M12 and the first output transistor M13 are used to form as a current mirror generating the first mirror current $I_{OUT1}$. Then, the first signal processing unit 1626 generates the first voltage signal VT1 according to the first reference current $I_{REF1}$ and the first mirror current $I_{OUT1}$.

According to the method for monitoring voltage of power supply according to the first embodiment of the present application, the first threshold value Vth1 and the second threshold value Vth2 can be expressed as follows:

$$V_{th1} \approx \left[ \frac{I_{REF1} \times Z_U}{K} + \left(1 + \frac{Z_U}{Z_D}\right) \times VC \right] / \sqrt{2}$$

$$V_{th2} \approx \left( \frac{Z_U + Z_D}{Z_D} \times V_{V_{REF1}} \right) / \sqrt{2}$$

In the following, use simple values as an example. Assume that the first threshold value Vth1 and the second threshold value Vth2 are set to be 300 VAC and 80 VAC respectively; the clamp threshold value VC is selected as 1V; the second reference voltage $V_{REF1}$ is selected as 0.8V; the ratio of the first mirror current $I_{OUT1}$ to the detection current $I_{IN1}$, K, is selectively set as 1. The above values are typically preset as default parameter values in IC design and IC fabrication. On the other hand, the first and second impedance elements $Z_U$, $Z_D$ are normally coupled to external devices at outside of an IC. Thereby, according to operating of the above equations and using the above default parameter values, the impedance values of the first and second impedance elements $Z_U$, $Z_D$ are 5.6561 MΩ and 40.2849 kΩ, respectively, for correctly setting the first and second threshold values Vth1, Vth2 to 300 VAC and 80 VAC, respectively.

Furthermore, assume that the first threshold value Vth1 should be adjusted to 250 VAC while the second threshold value Vth2 should be kept 80 VAC. Under that the above default parameter values in determined are fixed, the impedance values of the first and second impedance elements $Z_U$, $Z_D$ are 4.1311 MΩ and 29.4194 kΩ according to operating of the above equations, respectively. Thereby, the first threshold value Vth1 can be adjusted to 250 VAC without influencing the second threshold value Vth2.

According to the embodiment of the present application, although only a voltage division node is used to monitor the input voltage, independent setting and adjustment of the first and second threshold values Vth1, Vth2 can be achieved by adjusting the impedance values of the first and second impedance elements $Z_U$, $Z_D$. Then, the interdependency between the first and second threshold values Vth1, Vth2 is not existed. According to the present embodiment, the impedance values of the first and second impedance elements $Z_U$, $Z_D$ are resistance values. Nonetheless, the present application is not limited to the embodiment. Alternatively, the first and second impedance elements $Z_U$, $Z_D$ can be capacitors or inductors. In other words, according to the present application, the first and second threshold values Vth1, Vth2 can be set or adjusted by using the first reference current $I_{REF1}$, the reference voltage $V_{REF1}$, a first impedance value of the first impedance element $Z_U$, and a second impedance value of the second impedance element $Z_D$.

Figure 7:
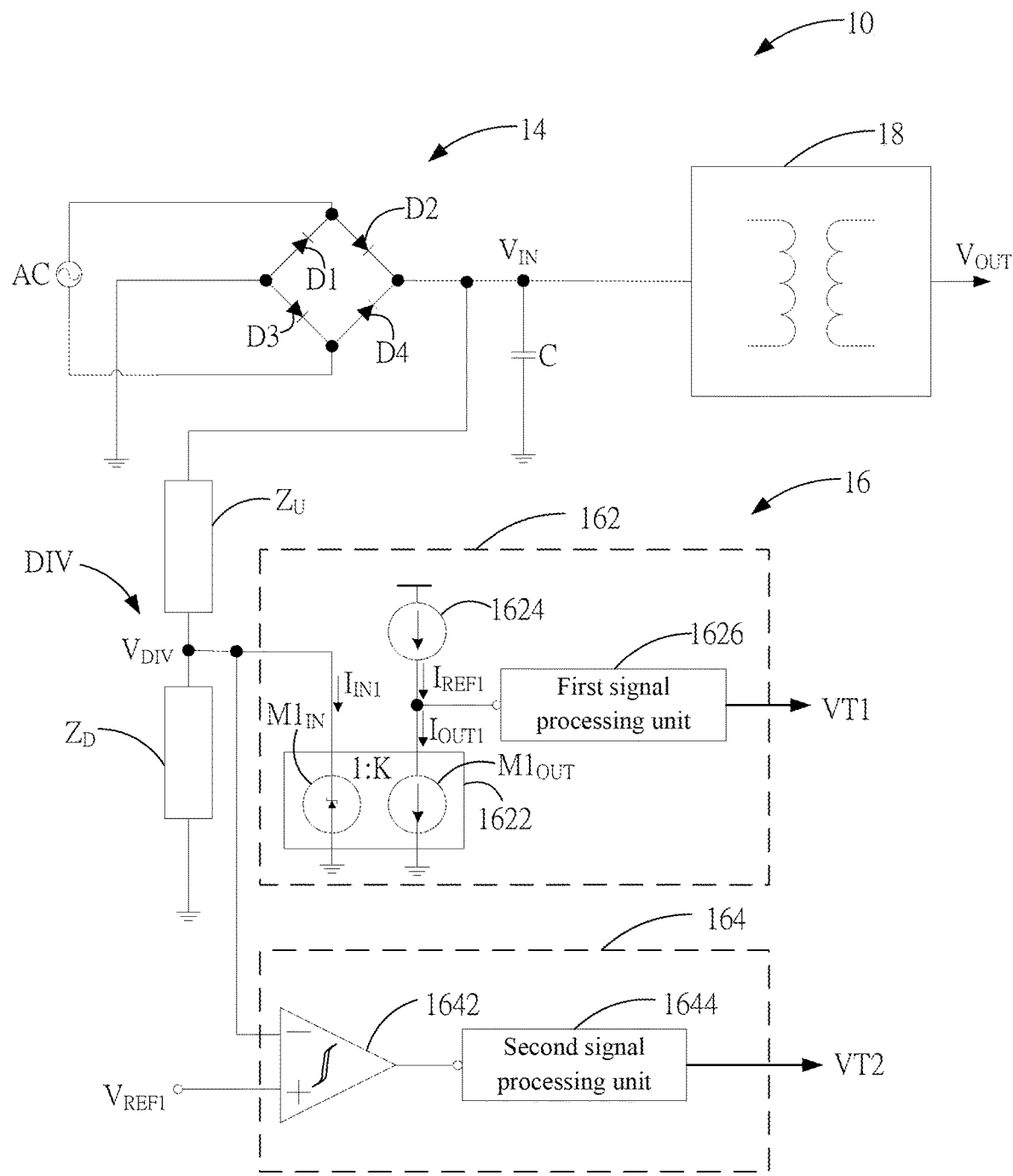
FIG. 7 shows a schematic diagram of the circuit according to the second embodiment of the present application.

FIG. 7 shows a schematic diagram of the circuit according to the second embodiment of the present application. The difference between FIG. 2 and FIG. 7 is that the voltage monitoring circuit 16 in FIG. 2 is coupled to a voltage extraction unit 12, namely, between the AC power source AC and the rectifying circuit 14. On the contrary, the voltage monitoring circuit 16 in FIG. 7 is coupled between the rectifying circuit 14 and the power supply 18. Because the voltage division circuit DIV according to the present embodiment generates the divided voltage $V_{DIV}$ according to the input voltage $V_{IN}$ directly, the divided voltage $V_{DIV}$ according to the present embodiment is directly related to the input voltage $V_{IN}$. Besides, the power supplying device 10A according to the present embodiment does not include the voltage extraction unit 12.

According to the present embodiment, except that the divided voltage VOW is generated by directly receiving the rectified input voltage $V_{IN}$, the rest operations of signals are identical to the first embodiment. Hence, the details will not be described again.

Figure 8:
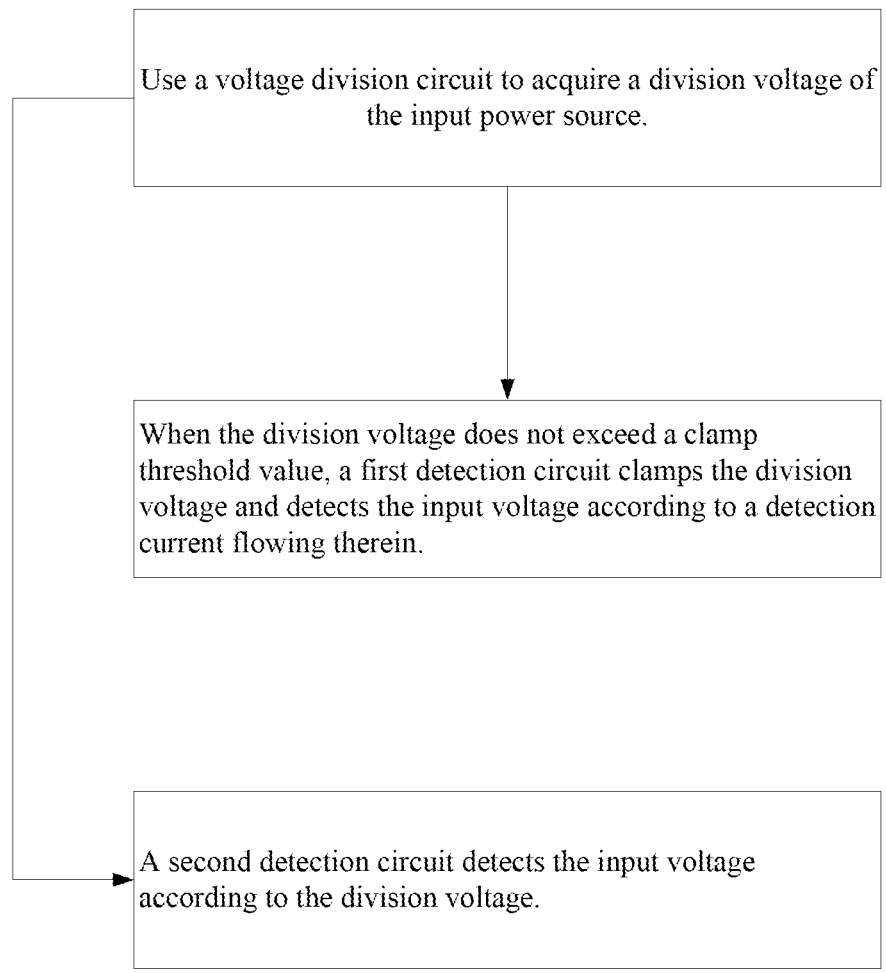
FIG. 8 shows a flowchart of the method for voltage monitoring of the power supply according to another embodiment of the present application.

According to the above embodiment, the first detection circuit 162 detects if the input voltage $V_{IN}$ is greater than the first threshold value according to the detection current $I_{IN1}$; the second detection circuit 164 detects if the input voltage $V_{IN}$ is less than the second threshold value Vth2 according to the divided voltage $V_{DIV}$. Nonetheless, the present application is not limited to the embodiment. The two arrangements can be exchanged. Please refer FIG. 8, which shows a flowchart of the method for monitoring voltage of power supply according to another embodiment of the present application. The related circuits will be described in details as follows.

Figure 9:
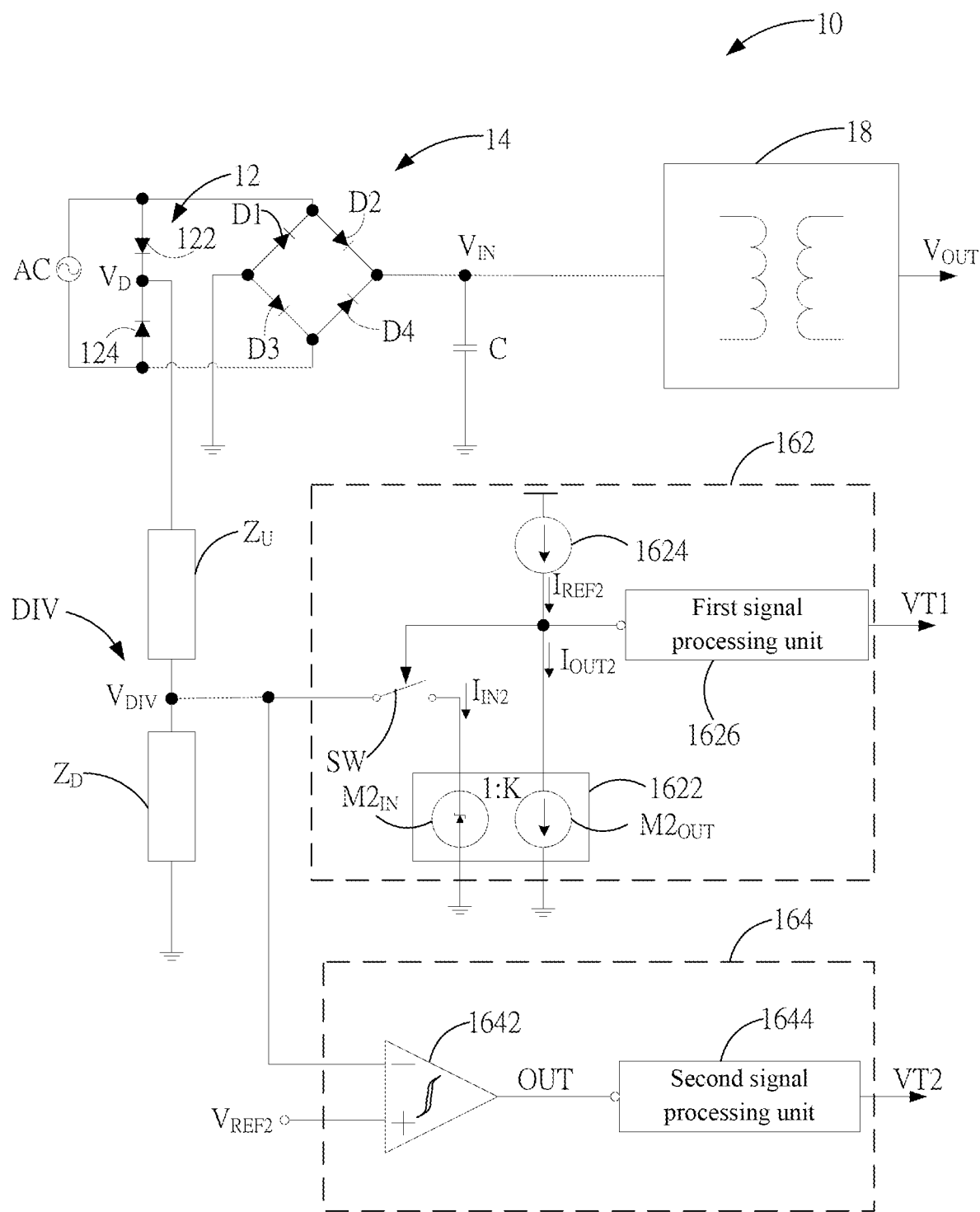
FIG. 9 shows a schematic diagram of the circuit according to the third embodiment of the present application.
Figure 10:
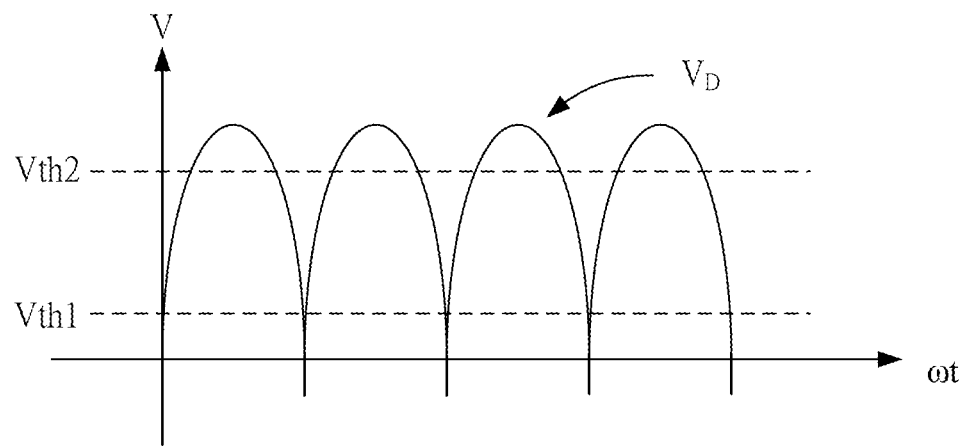
FIG. 10 shows a flowchart of the method for voltage monitoring of the power supply according to the third embodiment of the present application.

FIG. 9 shows a schematic diagram of the circuit according to the third embodiment of the present application. According to the above embodiment, the first detection circuit 162 can be turned on or cut off according to the magnitude of the divided voltage $V_{DIV}$ by using the input transistor M11 of the first mirror input unit $M1_{IN}$. Nonetheless, according to the present embodiment, the first detection circuit 162 can further include a switch SW controlled by the first signal processing unit VT1 for determining whether to turn on a detection current $I_{IN2}$. On the other hand, the current mirror 1622 according to the present embodiment includes a second mirror input unit $M2_{IN}$ and a second mirror output unit $M2_{OUT}$. In addition, the reference current source 1624 according to the present embodiment provides a second reference current $I_{REF2}$. When the divided voltage $V_{DIV}$ does not exceed the clamp threshold value VC, the switch SW is closed for clamping the divided voltage $V_{DIV}$ and thus turning on the detection current $I_{IN2}$ flowing to the second current mirror 1646. The second current mirror 1646 includes a first mirror input unit $M2_{IN}$ and a second mirror output unit $M2_{OUT}$. The first mirror input unit $M2_{IN}$ receives the detection current $I_{IN2}$. Likewise, the second mirror output unit $M2_{OUT}$ generates a corresponding second mirror current $I_{OUT2}$. Then, the first signal processing unit 1626 judges of the input voltage $V_{IN}$ is less than the first threshold value Vth1 according to the second reference current $I_{REF2}$ and the second mirror current $I_{OUT2}$. When this occurs, the first signal processing unit 1626 generates the first voltage signal VT1. At this moment, as shown in FIG. 10, the first threshold value Vth1 according to the present embodiment is the lower threshold value.

Once the extraction voltage $V_D$ is increased to enabling the divided voltage $V_{DIV}$ to exceed the clamp threshold value VC, the switch SW is open. Then, the first detection circuit 162 will stop clamping the divided voltage $V_{DIV}$. The second detection circuit 164 according to the present embodiment receives the divided voltage $V_{DIV}$. Thereby, the comparator 1642 generates the comparison result OUT to the second signal processing unit 1644 according to a reference voltage $V_{REF2}$ and the divided voltage $V_{DIV}$. The second signal processing unit 1644 judges if the input voltage $V_{IN}$ is greater than the second threshold value Vth2 according to the comparison result OUT. When this occurs, the second signal processing unit 1644 generates the second voltage signal VT2. According to the present embodiment, the second threshold value Vth2 is greater than the first threshold value Vth1. Thereby, according to the present embodiment, the first detection circuit 162 detects the input voltage $V_{IN}$ according to the lower threshold voltage Vth1 and the second detection circuit 164 detects the input voltage $V_{IN}$ according the higher threshold voltage Vth2.

Figure 11:
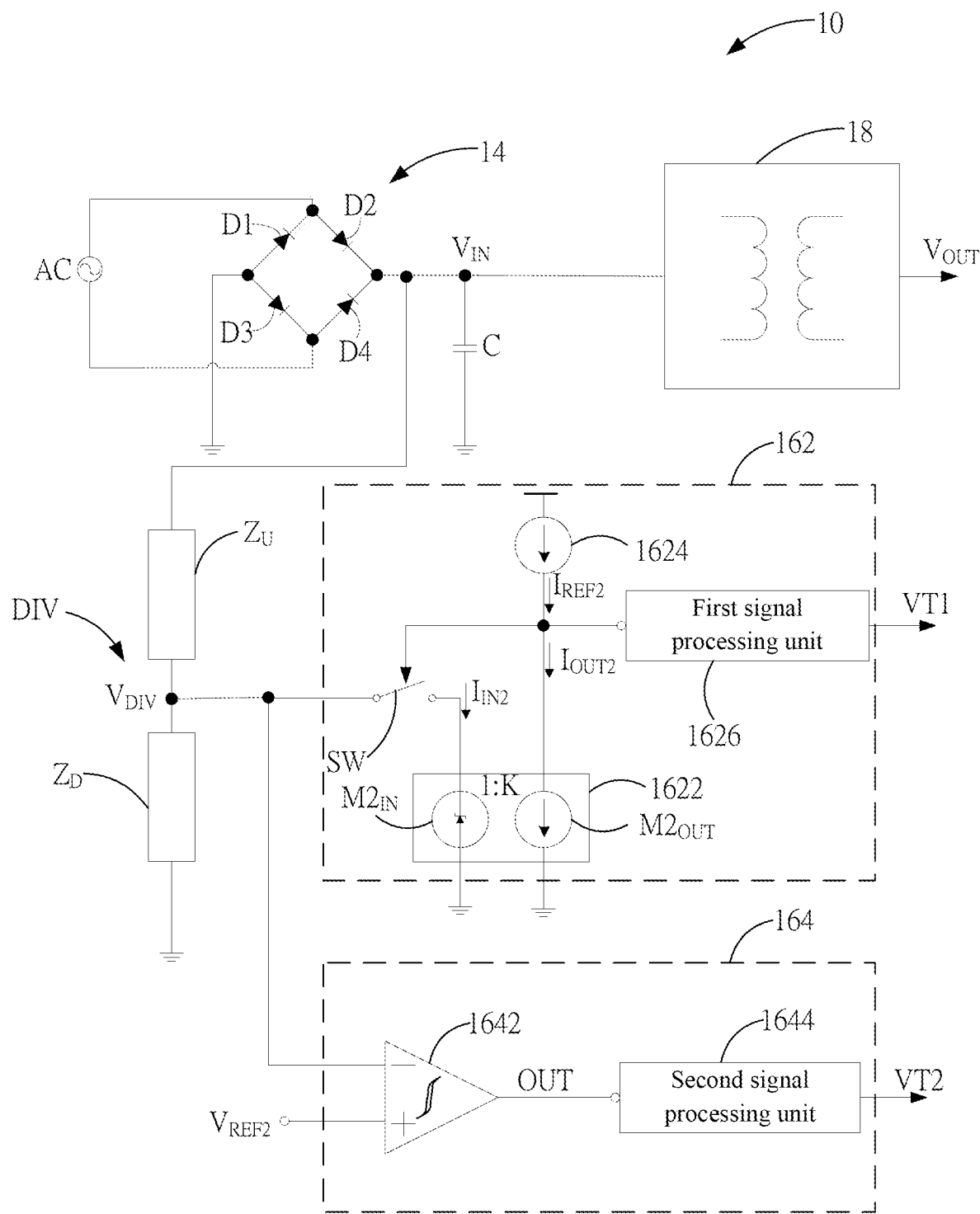
FIG. 11 shows a schematic diagram of the circuit according to the fourth embodiment of the present application.

FIG. 11 shows a schematic diagram of the circuit according to the fourth embodiment of the present application. According to the present embodiment, the division circuit DIV is changed to be coupled between the rectifying circuit 14 and the power supply 18. The rest relationship of the fourth embodiment is identical to the above embodiment. Hence, the details will not be described again.

Likewise, according to the third and fourth embodiments of the present application, the first threshold value Vth1 or the second threshold value Vth2 of the voltage monitoring circuit 16 can be set or adjusted by independently setting the impedance values of the first and second impedance elements $Z_U$, $Z_D$. In addition, the interdependency between the first threshold value Vth1 and the second threshold value Vth2 is not existed.

According to the present embodiment, the impedance values of the first and second impedance elements $Z_U$, $Z_D$ are resistance values. Nonetheless, the present application is not limited to the embodiment. Alternatively, the first and second impedance elements $Z_U$, $Z_D$ can be capacitors or inductors. In other words, according to the present application, the first and second threshold values Vth1, Vth2 can be set or adjusted using the reference voltage $V_{REF2}$, the second reference current $I_{REF2}$, a first impedance value of the first impedance element $Z_U$, and a second impedance value of the second impedance element $Z_D$.

Accordingly, the present application conforms to the legal requirements owing to its novelty, nonobviousness, and utility. Hereby, the present application is submitted, and pray to obtain the allowance of the present application early, appreciating very much.

However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. A method for monitoring a voltage of a power supply, applicable to monitoring an input voltage transmitted to an input power source of the power supply by a rectifying circuit, comprising:

detecting said input voltage according to a divided voltage of said input voltage by a first detection circuit and a second detection circuit, said divided voltage of said input voltage acquired by using a voltage division circuit, said voltage division circuit including a first impedance element and a second impedance element; and generating a first voltage signal or a second voltage signal according to said divided voltage, a first threshold value, and a second threshold value by said first detection circuit and said second detection circuit;

wherein when said divided voltage exceeds a clamp threshold value, said first detection circuit clamps said divided voltage and detects said input voltage according to a detection current flowing therein; said second detection circuit detects said input voltage according to said divided voltage; said first detection circuit generates the first voltage signal when said first detection circuit judges that said input voltage is greater than a first threshold value according to a current value of said detection current; and said second detection circuit generates said second voltage signal when said second detection circuit judges that said input voltage is less than a second threshold value according to a voltage value of said divided voltage.

2. The method for monitoring the voltage of the power supply of claim 1, wherein said first detection circuit judges if said input voltage is greater than said first threshold value according to a reference current and said detection current; and said second detection circuit judges if said input voltage is less than said second threshold value according to a reference voltage and said divided voltage.

3. The method for monitoring the voltage of the power supply of claim 2, wherein said first threshold value and said second threshold value are set or adjusted according to said reference current, said reference voltage, a first impedance value of said first impedance element, and a second impedance value of said second impedance element.

4. The method for monitoring the voltage of the power supply of claim 3, further comprising setting or adjusting said first threshold value and said second threshold value independently by adjusting said first impedance value and said second impedance value.

5. The method for monitoring the voltage of the power supply of claim 1, wherein said power supply executes a first operating mechanism according to said first voltage signal and said power executes a second operating mechanism according to said second voltage signal.

6. The method for monitoring the voltage of the power supply of claim 5, wherein said first operating mechanism is an over voltage protection, a high voltage judgement, or an input voltage switching; said second operating mechanism is a low voltage protection or a minimum startup voltage setup.

7. A method for monitoring a voltage of a power supply, applicable to monitoring an input voltage transmitted to an input power source of said power supply by a rectifying circuit, and comprising:
- detecting said input voltage according to a divided voltage of said input voltage by a first detection circuit and a second detection circuit, said divided voltage acquired by using a voltage division circuit, said voltage division circuit including a first impedance element and a second impedance element, and; and
- generating a first voltage signal or a second voltage signal according to said divided voltage, a first threshold value, and a second threshold value by said first detection circuit and said second detection circuit;
- wherein when said divided voltage fails to exceed a clamp threshold value, said first detection circuit clamps said divided voltage and detects said input voltage according to a detection current flowing therein; said second detection circuit detects said input voltage according to said divided voltage; said first detection circuit generates the first voltage signal when said first detection circuit judges that said input voltage is less than said first threshold value according to said detection current; and said second detection circuit generates said second voltage signal when said second detection circuit judges that said input voltage is greater than said second threshold value according to said divided voltage.

8. The method for monitoring the voltage of the power supply of claim 7, wherein said first detection circuit judges if said input voltage is less than said first threshold value according to a reference current and said detection current; and said second detection circuit judges if said input voltage is greater than said second threshold value according to a reference voltage and said divided voltage.

9. The method for monitoring the voltage of the power supply of claim 8, wherein said first threshold value and said second threshold value are set or adjusted according to said reference current, said reference voltage, a first impedance value of said first impedance element, and a second impedance value of said second impedance element.

10. The method for monitoring the voltage of the power supply of claim 9, further comprising setting or adjusting said first threshold value and said second threshold value independently by adjusting said first impedance value and said second impedance value.

11. The method for monitoring the voltage of the power supply of claim 7, wherein said power supply executes a first mechanism according to said first voltage signal and said power executes a second mechanism according to said second voltage signal.

12. The method for monitoring the voltage of the power supply of claim 11, wherein said first mechanism is an over voltage protection, a high voltage judgement, or an input voltage switching; said second mechanism is a low voltage protection or a minimum startup voltage setup.

13. A circuit for monitoring a voltage of a power supply, applied for monitoring an input voltage transmitted to an input power source of said power supply by a rectifying circuit, and comprising:
- a first detection circuit, coupled between a first impedance element and a second impedance element of a voltage division circuit to acquire a divided voltage of said input power source, and said first detection circuit clamping said divided voltage and detecting said input voltage according to a detection current flowing therein when said divided voltage exceeds a clamp threshold value; and
- a second detection circuit, coupled between said first impedance element and said second impedance element to acquire said divided voltage, and detecting said input voltage according to said divided voltage;
- wherein said first detection circuit generates a first voltage signal when said first detection circuit judges that said input voltage is greater than said first threshold value according to said detection current; and said second detection circuit generates a second voltage signal when said second detection circuit judges that said input voltage is less than said second threshold value according to said divided voltage.

14. The circuit for monitoring the voltage of the power supply of claim 13, wherein said first detection circuit judges if said input voltage is greater than said first threshold value according to a reference current and said detection current; and said second detection circuit judges if said input voltage is less than said second threshold value according to a reference voltage and said divided voltage.

15. The circuit for monitoring the voltage of the power supply of claim 14, wherein said first threshold value and said second threshold value are set or adjusted according to said reference current, said reference voltage, a first impedance value of said first impedance element, and a second impedance value of said second impedance element.

16. The circuit for monitoring the voltage of the power supply of claim 13, wherein said first detection circuit includes a current mirror; said detection current is an input current of said current mirror; an output current of said current mirror is a multiple of said detection current; and said output current is compared with a reference current for judging if said input voltage is greater than said first threshold value.

17. The circuit for monitoring the voltage of the power supply of claim 16, wherein said first detection circuit further includes a switch coupled between said first impedance element and said second impedance element and to said current mirror; when said divided voltage exceeds said clamp threshold value, said first detection circuit closes said switch to clamp said divided voltage, to maintain said divided voltage equal or close to said clamp threshold value, and to generate said detection current flowing into said current mirror.

18. A circuit for monitoring a voltage of a power supply, applied for monitoring an input voltage of an input power source of a power supply transmitted by a rectifying circuit, and comprising:
- a first detection circuit, coupled between a first impedance element and a second impedance element of a voltage division circuit for acquiring a divided voltage of said input power source, and said first detection circuit clamping said divided voltage and detecting said input voltage according to a detection current flowing therein when said divided voltage does not exceed a clamp threshold value; and
- a second detection circuit, coupled between said first impedance element and said second impedance element for acquiring said divided voltage, and detecting said input voltage according to said divided voltage;
- wherein said first detection circuit generates a first voltage signal when said first detection circuit judges that said input voltage is less than said first threshold value according to said detection current; and said second detection circuit generates a second voltage signal when said second detection circuit judges that said input voltage is greater than said second threshold value according to said divided voltage.

19. The circuit for monitoring a voltage of the power supply of claim 18, wherein said first detection circuit judges if said input voltage is less than said first threshold value according to a reference current and said detection current; and said second detection circuit judges if said input voltage is greater than said second threshold value according to a reference voltage and said divided voltage.

20. The circuit for monitoring the voltage of the power supply of claim 19, wherein said first threshold value and said second threshold value are set or adjusted according to said reference current, said reference voltage, a first impedance value of said first impedance element, and a second impedance value of said second impedance element.

21. The circuit for monitoring the voltage of the power supply of claim 18, wherein said first detection circuit includes a current mirror; said detection current is an input current of said current mirror; an output current of said current mirror is a multiple of said detection current; and said output current is compared with a reference current for judging if said input voltage is less than said first threshold value.

22. The circuit for monitoring the voltage of the power supply of claim 21, wherein said first detection circuit further includes a switch coupled between said first impedance element and said second impedance element and to said current mirror; when said divided voltage does not exceed said clamp threshold value, said first detection circuit closes said switch to clamp said divided voltage, to maintain said divided voltage equal or close to said clamp threshold value, and to generate said detection current flowing into said current mirror.

* * * * *